United States Patent
Kang et al.

(10) Patent No.: US 9,752,051 B2
(45) Date of Patent: Sep. 5, 2017

(54) POLYARYLENE POLYMERS

(71) Applicants: Rohm and Haas Electronic Materials Korea Ltd., Cheonan (KR); Rohm and Haas Electronic Materials LLC, Marlborough, MA (US)

(72) Inventors: Yerang Kang, Bundang-Gu (KR); Young Seok Kim, Shrewsbury, MA (US); Peng-Wei Chuang, Santa Clara, CA (US); Christopher Gilmore, Natick, MA (US); Tae Hwan Kim, Seoul (KR); Herong Lei, Acton, MA (US)

(73) Assignees: Rohm and Haas Electronic Materials LLC, Marlborough, MA (US); Rohm and Haas Electronic Materials Korea Ltd. (KR)

( * ) Notice: Subject to any disclaimer, the term of this patent is extended or adjusted under 35 U.S.C. 154(b) by 0 days.

(21) Appl. No.: 15/060,029

(22) Filed: Mar. 3, 2016

(65) Prior Publication Data

US 2016/0289493 A1    Oct. 6, 2016

Related U.S. Application Data

(60) Provisional application No. 62/143,781, filed on Apr. 6, 2015.

(51) Int. Cl.

| | | |
|---|---|---|
| C09D 165/02 | (2006.01) | |
| C08G 61/02 | (2006.01) | |
| C08G 61/10 | (2006.01) | |
| C08G 61/12 | (2006.01) | |
| C09D 165/00 | (2006.01) | |
| C08K 5/3492 | (2006.01) | |
| H01L 21/02 | (2006.01) | |
| C08K 5/3435 | (2006.01) | |
| H01L 23/14 | (2006.01) | |

(52) U.S. Cl.
CPC .......... *C09D 165/02* (2013.01); *C08G 61/02* (2013.01); *C08G 61/10* (2013.01); *C08G 61/12* (2013.01); *C08K 5/3435* (2013.01); *C08K 5/3492* (2013.01); *C09D 165/00* (2013.01); *H01L 21/02118* (2013.01); *C08G 2261/135* (2013.01); *C08G 2261/362* (2013.01); *C08G 2261/364* (2013.01); *C08G 2261/46* (2013.01); *C08G 2261/592* (2013.01); *C08G 2261/596* (2013.01); *C08G 2261/65* (2013.01); *C08G 2261/76* (2013.01); *H01L 23/145* (2013.01)

(58) Field of Classification Search
CPC .. C08G 61/10; C08G 2261/46; C09D 165/02; C08K 5/3435; C08K 5/3492
USPC .................... 524/554; 427/385.5; 525/328.1
See application file for complete search history.

(56) References Cited

U.S. PATENT DOCUMENTS

| | | | |
|---|---|---|---|
| 4,046,749 A * | 9/1977 | Hawkins ............... | C07C 321/00 528/481 |
| 5,185,391 A | 2/1993 | Stokich | |
| 5,352,745 A | 10/1994 | Katayose et al. | |
| 5,965,679 A | 10/1999 | Godschalx et al. | |
| 6,646,081 B2 * | 11/2003 | Godschalx ............ | C08G 61/00 257/E23.167 |
| 6,767,937 B2 | 7/2004 | Schunk et al. | |
| 6,800,381 B2 | 10/2004 | Cho et al. | |
| 8,143,324 B2 | 3/2012 | So et al. | |
| 2002/0099158 A1 | 7/2002 | Godschalx et al. | |
| 2004/0126586 A1 * | 7/2004 | Hedrick ................ | C08G 61/00 428/411.1 |
| 2005/0176915 A1 | 8/2005 | Cho et al. | |
| 2009/0081377 A1 | 3/2009 | Kubo | |
| 2009/0264544 A1 | 10/2009 | Loy | |
| 2012/0010329 A1 | 1/2012 | Hunter et al. | |

FOREIGN PATENT DOCUMENTS

| | | |
|---|---|---|
| JP | 200523211 A | 9/2005 |
| WO | 9311189 A1 | 6/1993 |
| WO | 9405645 A1 | 3/1994 |
| WO | 0011096 A1 | 3/2000 |
| WO | 2011139111 A1 | 11/2011 |
| WO | 2012064074 A1 | 5/2012 |

OTHER PUBLICATIONS

Search report for corresponding European Application No. 16 15 8648 dated May 30, 2016.

* cited by examiner

*Primary Examiner* — Fred M Teskin
(74) *Attorney, Agent, or Firm* — S. Matthew Cairns

(57) ABSTRACT

Compositions of arylene oligomers and certain curing agents are useful to provide arylene polymer coatings having improved mechanical properties when cured in an oxygen-containing atmosphere. Methods of curing such compositions are also provided.

13 Claims, 1 Drawing Sheet

POLYARYLENE POLYMERS

This application claims the benefit of provisional application Ser. No. 62/143,781, filed on Apr. 6, 2015.

The present invention relates generally to the field of dielectric materials useful in the manufacture of electronic devices, and more particularly to the use of arylene polymers in the manufacture of electronic devices.

BACKGROUND OF THE INVENTION

Due to their outstanding dielectric, thermal stability, chemical resistance, and flexibility properties, arylene polymers are widely used in the electronics industry. Achieving an adequate degree of cure in polyarylene polymers is essential to minimize any change in mechanical or other properties. During curing of arylene polymers, the competing processes of polymerization and oxidation occur simultaneously. Typically, arylene polymers, such as phenylene polymers, are cured at relatively high temperatures, such as 400 to 450° C., under an inert atmosphere, such as nitrogen, to minimize undesirable oxidation and/or thermal degradation of the polymers. Such inert atmosphere curing is acceptable for many applications. However, the use of an inert atmosphere for curing arylene films limits the adoption of arylene polymers in other applications where it would be difficult to maintain an inert atmosphere, such as in a continuous manufacturing process, for example, a roll-to-roll process. Accordingly, there remains a need for an arylene polymer compositions that can readily be cured in an oxygen-containing atmosphere.

SUMMARY OF THE INVENTION

The present invention provides a composition comprising one or more curable arylene oligomers, one or more curing agents and one or more organic solvents.

Also provided by the present invention is a method of curing an arylene oligomer comprising: coating a composition comprising one or more curable arylene oligomers, one or more curing agents, and one or more organic solvents on a substrate surface; at least partially removing the one or more organic solvents; and curing the one or more arylene oligomers in an oxygen-containing atmosphere.

The present invention further provides a method of forming a coated inorganic film comprising: providing an inorganic film; coating a layer of a composition comprising one or more curable arylene oligomers, one or more curing agents, and one or more organic solvents on a surface of the inorganic film; removing the one or more organic solvents from the coating layer; curing the coating layer in an oxygen-containing atmosphere to form a coated inorganic film.

BRIEF DESCRIPTIOPN OF THE DRAWINGS

DETAILED DESCRIPTION

Figure 1:
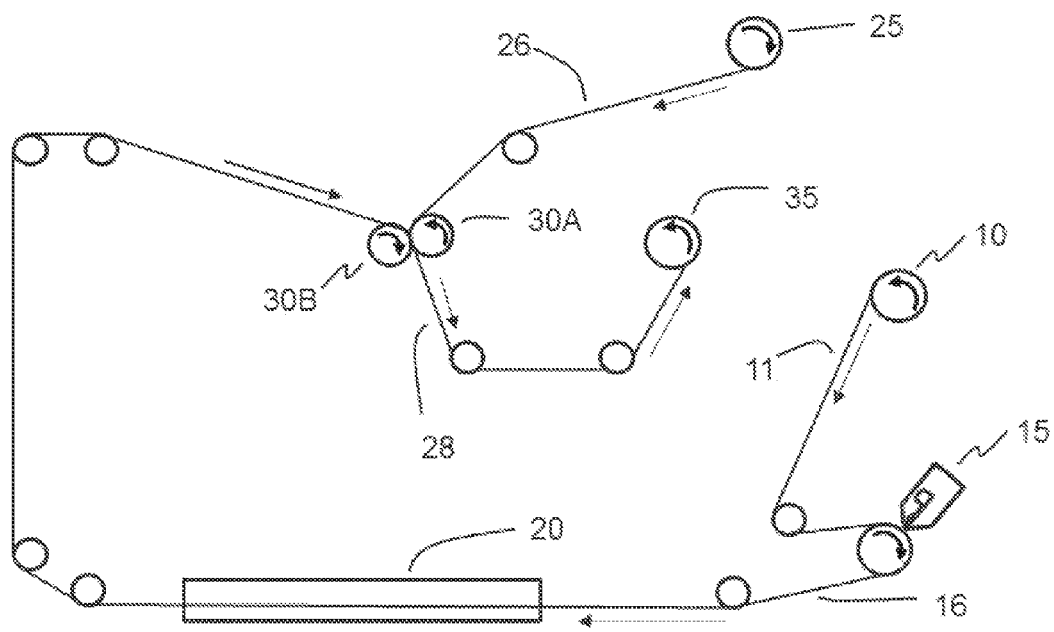
FIG. 1 is a cross-sectional representation illustrating a continuous process of the invention.

As used throughout this application, the following abbreviations shall have the following meanings, unless the context clearly indicates otherwise: ° C.=degree Celsius; g=gram; nm=nanometer; μm=micron=micrometer; mm=millimeter; sec.=second; min=minute; hr.=hour; DI=deionized; mL=milliliter; $M_n$=number average molecular weight; $M_w$=weight average molecular weight; and Da=Dalton. All amounts are percent by weight ("wt %") based on the total weight of the referenced composition, and all ratios are molar ratios, unless otherwise noted. All numerical ranges are inclusive and combinable in any order, except where it is clear that such numerical ranges are constrained to add up to 100%.

The articles "a", "an" and "the" refer to the singular and the plural, unless the context clearly indicates otherwise. As used herein, the term "and/or" includes any and all combinations of one or more of the associated listed items. "Alkyl" refers to linear, branched and cyclic alkyl unless otherwise specified. "Aryl" refers to aromatic carbocycles and aromatic heterocycles. The term "oligomer" refers to dimers, trimers, tetramers and other polymeric materials that are capable of further curing. By the term "curing" is meant any process, such as polymerization, that increases the molecular weight of a material or composition. "Curable" refers to any material capable of being cured under certain conditions. The terms "film" and "layer" are used interchangeably through this specification. The term "copolymer" refers to a polymer composed of 2 or more different monomers as polymerized units.

It will be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. When an element is referred to as being "disposed on" another element, it can be directly on the other element or intervening elements may be present therebetween. In contrast, when an element is referred to as being "disposed directly on" another element, there are no intervening elements present.

The present compositions comprise one or more curable arylene oligomers, one or more curing agents and one or more organic solvents.

Arylene oligomers of the present invention comprise as polymerized units a first monomer having two cyclopentadienone moieties and a second monomer having two or more alkyne moieties, wherein at least one alkyne moiety is directly bonded to a silicon atom. The oligomers of the present invention are polyarylenes, and preferably are polyphenylenes. Any monomer containing two cyclopentadienone moieties may suitably be used as the first monomer to prepare the present oligomers. Such monomers are well-known, such as those described in U.S. Pat. Nos. 5,965,679; 6,288,188; and 6,646,081; and in Int. Pat. Pubs. WO 97/10193 and WO 2004/073824. It is preferred that the first monomer has the structure shown in formula (1)

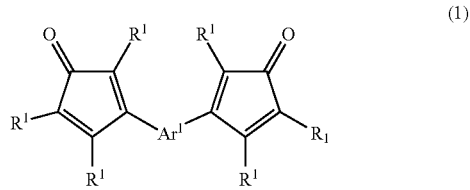

wherein each $R^1$ is independently chosen from H, $C_{1-6}$ alkyl, phenyl, or substituted phenyl; and $Ar^1$ is an aromatic moiety. Preferably, each $R^1$ is independently chosen from $C_{3-6}$ alkyl, phenyl and substituted phenyl, and more preferably each $R^1$ is phenyl. By "substituted phenyl" it is meant a phenyl moiety having one or more of its hydrogens replaced with one or more substituents chosen from halogen, $C_{1-6}$ alkyl, $C_{1-6}$ haloalkyl, $C_{1-6}$ alkoxy, $C_{1-6}$ haloalkoxy, phenyl, and phenoxy, and preferably from halogen, $C_{1-4}$ alkyl, $C_{1-4}$ haloalkyl, $C_{1-4}$ alkoxy, $C_{1-4}$ haloalkoxy, and phenyl. It is preferred that substituted phenyl is a phenyl moiety having one or more of its hydrogens replaced with one or more substituents chosen from halogen, $C_{1-6}$ alkyl, $C_{1-6}$ alkoxy, phenyl, and phenoxy. Preferably, a substituted phenyl has from 1 to 3 substituents, and more preferably 1 or 2 substituents. A wide variety of aromatic moieties are suitable for use as $Ar^1$, such as those disclosed in U.S. Pat. No. 5,965,679. Exemplary aromatic moieties useful for $Ar^1$ include those having the structure shown in formula (2)

$$Ar^2 Z - Ar^2 \qquad (2)$$

wherein x is an integer chosen from 1, 2 or 3; y is an integer chosen from 0, 1, or 2; each $Ar^2$ is independently chosen from

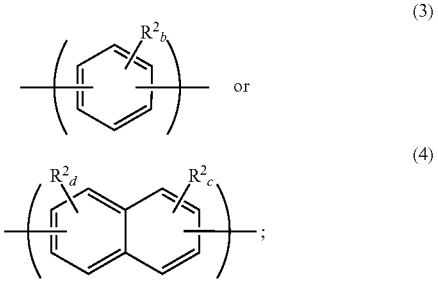

each $R^2$ is independently chosen from halogen, $C_{1-6}$ alkyl, $C_{1-6}$ haloalkyl, $C_{1-6}$ alkoxy, $C_{1-6}$ haloalkoxy, phenyl, and phenoxy; b is an integer from 0 to 4; each of c and d is an integer from 0 to 3; each Z is independently chosen from O, S, SO, $SO_2$, $NR^3$, $PR^3$, $P(=O)R^3$, $C(=O)$, $CR^4R^5$, and $SiR^4R^5$; $R^3$, $R^4$, and $R^5$ are independently chosen from H, $(C_1-C_4)$alkyl, halo$(C_1-C_4)$alkyl, and phenyl. It is preferred that x is 1 or 2, and more preferably 1. It is preferred that y is 0 or 1, and more preferably 1. Preferably, each $R^2$ is independently chosen from halogen, $C_{1-4}$ alkyl, $C_{1-4}$ haloalkyl, $C_{1-4}$ alkoxy, $C_{1-4}$ haloalkoxy, and phenyl, and more preferably from fluoro, $C_{1-4}$ alkyl, $C_{1-4}$ fluoroalkyl, $C_{1-4}$ alkoxy, $C_{1-4}$ fluoroalkoxy, and phenyl. It is preferred that b is from 0 to 3, more preferably from 0 to 2, and yet more preferably 0 or 1. It is preferred that c is from 0 to 2, and more preferably from 0 or 1. It is also preferred that d is from 0 to 2, and more preferably 0 or 1. In formula (4), it is preferred that c+d=0 to 4, and more preferably 0 to 2. Each Z is preferably independently chosen from O, S, $NR^3$, $C(=O)$, $CR^4R^5$, and $SiR^4R^5$, more preferably from O, S, $C(=O)$, and $CR^4R^5$, and yet more preferably from O, $C(=O)$, and $CR^4R^5$. It is preferred that each $R^3$, $R^4$, and $R^5$ are independently chosen from H, $C_{1-4}$ alkyl, $C_{1-4}$ fluoroalkyl, and phenyl; and more preferably from H, $C_{1-4}$ alkyl, $C_{1-2}$ fluoroalkyl, and phenyl. Preferably, each $Ar^2$ has the structure (3).

The second monomer useful in preparing the present oligomers has two or more alkyne moieties. Preferably the second monomer is aromatic, more preferably comprises an aromatic ring substituted with 2 or more alkyne moieties, and yet more preferably comprises an aromatic ring substituted with 2 or 3 alkyne moieties. Suitable second monomers are those of formula (5) and formula (6)

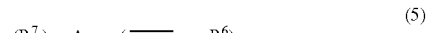

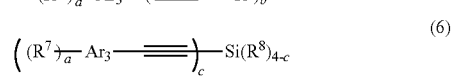

wherein a is an integer from 0 to 4; b is 2 or 3; c is 2 or 3; each $R^6$ is independently chosen from H, $Si(R^8)_3$, $C_{1-10}$ alkyl, $C_{1-10}$ alkoxy, $C_{7-15}$ aralkyl, $C_{6-10}$ aryl, and substituted $C_{6-10}$ aryl; each $R^7$ is independently chosen from H, $C_{1-10}$ alkyl, $C_{1-10}$ alkoxy, $C_{7-15}$ aralkyl, $C_{6-10}$ aryl, and substituted $C_{6-10}$ aryl; each $R^8$ is independently chosen from H, halogen, hydroxyl, $C_{1-10}$ alkyl, $C_{1-10}$ alkoxy, $C_{7-15}$ aralkyl, $C_{7-15}$ aralkoxy, $C_{6-10}$ aryl, $C_{6-20}$ aryloxy, and substituted $C_{6-10}$ aryl; and $Ar^3$ is $C_{6-10}$ aryl. Preferably, each $R^8$ is independently chosen from H, hydroxyl, $C_{1-6}$ alkyl, $C_{1-6}$ alkoxy, $C_{7-12}$ aralkyl, $C_{7-15}$ aralkoxy, $C_{6-10}$ aryl, $C_{6-15}$ aryloxy, and substituted $C_{6-10}$ aryl, and more preferably each $R^8$ is independently chosen from H, hydroxyl, methyl, ethyl, propyl, butyl, methoxy, ethoxy, propoxy, butoxy, phenyl, benzyl, phenethyl, and phenoxy. $Ar^3$ is preferably phenyl or naphthyl, and more preferably phenyl. "Substituted $C_{6-10}$ aryl" refers to any $C_{6-10}$ aryl moiety having one or more of its hydrogens replaced with one or more substituents chosen from halogen, $C_{1-4}$ alkyl, $C_{1-4}$ haloalkyl, $C_{1-4}$ alkoxy, $C_{1-4}$ haloalkoxy, and phenyl, and preferably from $C_{1-3}$ alkyl, $C_{1-3}$ haloalkyl, $C_{1-3}$ alkoxy, $C_{1-3}$ fluoroalkoxy, and phenyl. Fluorine is a preferred halogen. Preferably, the second monomer has the structure of formula (5). Preferred second monomers include 1,3-bis[(trimethylsilyeethynyl]benzene, 1,4-bis[(trimethylsilyl)ethynyl]-benzene, 1,3,5-tris(trimethylsilylethynyl)benzene, 1,3-bis[(trimethoxysilyl)ethynyl]benzene, 1,4-bis[(trimethoxysilyl)ethynyl]benzene, 1,3-bis[(dimethylmethoxysilyl)ethynyl]benzene, 1,4-bis[(dimethylmethoxysilyl)ethynyl]benzene, 1,3-phenylenebis(ethyne-2,1-diyl))bis(dimethyl-silanol), 1,4-phenylenebis(ethyne-2,1-diyl))bis(dimethylsilanol), bis(phenylethynyl)dimethyl-silane, and bis(phenylethynyl)dimethoxysilane, and more preferably 1,3-bis[(trimethylsilyl)ethynyl]benzene, 1,4-bis[(trimethylsilyl)ethynyl]benzene, 1,3-bis[(trimethoxysilyl)ethynyl]benzene, 1,4-bis [(trimethoxysilyl)ethynyl]benzene, 1,3-bis[(dimethylmethoxysilyl)ethynyl]benzene, 1,4-bis[(dimethylmethoxysilyl)ethynyl]benzene, 1,3-phenylenebis(ethyne-2,1-diyl))bis(dimethylsilanol), and 1,4-phenylenebis(ethyne-2,1-diyl))bis(dimethylsilanol). Compounds useful as the second monomers may be prepared by a variety of procedures known in the art, or are generally commercially available, such as from Sigma Aldrich (Milwaukee Wis.), TCI America (Portland, Oreg.), or Gelest, Inc. (Tullytown, Pa.).

The oligomers of the present invention are prepared by reacting one or more first monomers with one or more second monomers, and any optional third monomers, in a suitable organic solvent. The mole ratio of the total first monomers to the total second monomers is from 2.5:1 to 1:2.5, preferably from 1:2 to 2:1, and more preferably from 1.75:1 to 1:1.75. When an optional third monomer is used, it is typically used in an amount of 0.001 to 0.2 equivalents, based on the first monomer. Suitable organic solvents useful to prepare the present oligomers are benzyl esters of $C_{2-6}$ alkanecarboxylic acids, dibenzyl esters of $C_{2-6}$ alkanedicarboxylic acids, tetrahydrofurfuryl esters of $C_{2-6}$ alkanecarboxylic acids, ditetrahydrofurfuryl esters of $C_{2-6}$ alkanedicarboxylic acids, phenethyl esters of $C_{2-6}$ alkanecarboxylic acids, diphenethyl esters of $C_{2-6}$ alkanedicarboxylic acids, cycloalkanones, and aromatic solvents. Preferred aromatic solvents are aromatic hydrocarbons and aromatic ethers. Suitable aromatic hydrocarbons are mesitylene, p-cymene, xylene, and toluene. Suitable aromatic ethers are diphenyl ether, dibenzyl ether, $C_{1-6}$ alkoxy-substituted benzenes and benzyl $C_{1-6}$ alkyl ethers, and more preferably $C_{1-4}$ alkoxy-substituted benzenes and benzyl $C_{1-4}$ alkyl ethers. Suitable cycloalkanones are cyclopentanone, cyclohexanone, cycloheptanone and cyclooctanone. Preferred organic solvents are benzyl esters of $C_{2-4}$ alkanecarboxylic acids, dibenzyl esters of $C_{2-4}$ alkanedicarboxylic acids, tetrahydrofurfuryl esters of $C_{2-4}$ alkanecarboxylic acids, ditetrahydrofurfuryl esters of $C_{2-4}$ alkanedicarboxylic acids, phenethyl esters of $C_{2-4}$ alkanecarboxylic acids, diphenethyl esters of $C_{2-4}$ alkanedicarboxylic acids, $C_{1-6}$ alkoxy-substituted benzenes, and benzyl $C_{1-6}$ alkyl ethers, more preferably benzyl esters of $C_{2-6}$ alkanecarboxylic acids, tetrahydrofurfuryl esters of $C_{2-6}$ alkanecarboxylic acids, phenethyl esters of $C_{2-6}$ alkanecarboxylic acids, $C_{1-4}$ alkoxy-substituted benzenes, benzyl $C_{1-4}$ alkyl ethers, and dibenzyl ether, and yet more preferably benzyl esters of $C_{2-6}$ alkanecarboxylic acids, tetrahydrofurfuryl esters of $C_{2-6}$ alkanecarboxylic acids, $C_{1-4}$ alkoxy-substituted benzenes, and benzyl $C_{1-4}$ alkyl ethers. Exemplary organic solvents include, without limitation, benzyl acetate, benzyl proprionate, tetrahydrofurfuryl acetate, tetrahydrofurfuryl propionate, tetrahydrofurfuryl butyrate, cyclopentanone, cyclohexanone, cycloheptanone, cyclooctanone, mesitylene, p-cymene, xylene, toluene, anisole, methylanisole, dimethylanisole, dimethoxybenzene, ethylanisole, ethoxybenzene, benzyl methyl ether, and benzyl ethyl ether, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, and ethoxybenzene.

The oligomers of the present invention may be prepared by combining the one or more first monomers, the one or more second monomers, any optional third monomer, and organic solvent, each as described above, in any order in a vessel, and heating the mixture. The first monomer may first be combined with the organic solvent in a vessel, and the second monomer then added to the mixture. In one embodiment, the first monomer and organic solvent mixture is heated to the desired reaction temperature before the second monomer is added. The second monomer may be added at one time, or alternatively the second monomer may be added over a period of time, such as from 0.25 to 46 hr., and preferably from 2 to 18 hr., to reduce exotherm formation. The first monomer and organic solvent mixture may be heated to the desired reaction temperature before the second monomer is added. Alternatively, the first monomer, second monomer and solvent are added to a vessel, and then heated to the desired reaction temperature and held at this temperature for a period of time to provide the desired oligomer. The reaction mixture is heated at a temperature of 95 to 230° C. for a period of time, such as from 8 to 250 hours. Preferably, the mixture is heated to a temperature of 110 to 225° C., more preferably 125 to 225° C., and yet more preferably 150 to 220° C. Optionally, an acid catalyst may be added to the reaction in order to speed up the reaction. Any suitable acid may be used, such as sulfuric acid, phosphoric acid, polyphosphoric acid, hydrochloric acid, methylsulfonic acid, p-toluenesulfonic acid, trifluoromethanesulfonic acid, and the like. Following the reaction, the resulting oligomer may be isolated from the reaction mixture or used as is for coating a surface.

The oligomer of the present invention typically has a weight average molecular weight ($M_w$) in the range of 2000 to 100000, preferably from 2500 to 80000, more preferably from 2500 to 50000, and yet more preferably from 2500 to 30000. A particularly preferred $M_w$ range is from 5000 to 50000, and an even more preferred range is from 5000 to 30000. The molecular weight of the oligomer may be adjusted by means known to those skilled in the art. For example, longer reaction times lead to higher molecular weights. The molecular weight of the oligomer may also be controlled by adjusting the amount of the second monomer. For example, to obtain an oligomer having a $M_w$ of <35000, greater than 1.05 mole of the second monomer should be used for each 1 mole of the first monomer, that is, the mole ratio of first monomer to second monomer should be at least 1:1.05, such as from 1:1.055 to 1:2.25.

While not intending to be bound by theory, it is believed that the present arylene oligomers are formed through the Diels-Alder reaction of the cyclopentadienone moieties of the first monomer with the ethynyl moieties of the second monomer groups upon heating. During such Diels-Alder reaction, a carbonyl-bridged species forms. It will be appreciated by those skilled in the art that such carbonyl-bridged species may be present in the oligomers. Upon further heating, the carbonyl bridging species will be essentially fully converted to an aromatic ring system. Preferred arylene oligomers are phenylene oligomers sold under the SiLK™ brand, available from The Dow Chemical Company. Suitable arylene oligomers include those disclosed in U.S. Pat. No. 5,965,679 and in Stille et al., *Macromolecules*, vol. 1, no. 5, September-October 1968.

As used herein, the term "curing agent" refers to any material that reduces undesirable oxidation and/or thermal degradation of arylene oligomers during curing in an oxygen-containing atmosphere (≥100 ppm of oxygen) at a temperature in the range of 400 to 450° C., as compared to the same arylene oligomer cured under the same conditions without the use of such a curing agent. Suitable curing agents are materials that form a relatively stable radical under the conditions of curing the arylene oligomers, such as materials used as UV absorbers or light stabilizers. Preferred curing agents are sterically hindered amines, hydroxyaryl-1,3,5-triazines, condensates of sterically hindered amines with 1,3,5-triazines, and mixtures thereof, and more preferably steric ally hindered amines, hydroxyaryl-1,3,5-triazines, and mixtures thereof.

Suitable sterically hindered amines useful as curing agents in the present invention are those of formula (7)

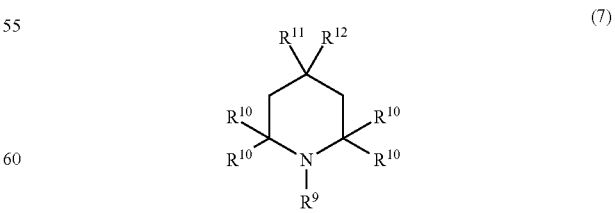

(7)

wherein $R^9$ is H, $O^-$ (an oxygen radical), or a monovalent organic radical having 1 to 20 carbon atoms; each $R^{10}$ is independently $C_{1-10}$ alkyl; $R^{11}$ is H or $C_{1-10}$ alkyl; $R^{12}$ is chosen from H, $R^{13}$, $OR^{14}$ or $NHR^{14}$; $R^{13}$ is an organic radical having from 1 to 25 carbon atoms; and $R^{14}$ is H or an organic radical having from 1 to 25 carbon atoms. Preferably, $R^9$ is H, O., $C_{1-4}$ alkyl, and $C_{1-10}$ alkoxy. It is preferred that each $R^{10}$ is independently $C_{1-6}$ alkyl, and more preferably each $R^{10}$ is methyl. Preferably, $R^{11}$ is H or $C_{1-8}$ alkyl, more preferably H or $C_{1-6}$ alkyl, and even more preferably H. $R^{12}$ is preferably $C_{1-10}$ alkyl, $OR^{13}$ or $NHR^{13}$, and more preferably $OR^{13}$ or $NHR^{13}$. Dimers of sterically hindered amines may also be suitably used in the present invention. Such dimers are represented by formula (7), where $R^{13}$ or $R^{14}$ is an organic radical comprising a linking moiety and a hindered piperidinyl moiety. Exemplary sterically hindered amines include, but are not limited to, (2,2,6,6-tetramethylpiperidin-1-yl)oxyl, 4-hydroxy-(2,2,6,6-tetramethylpiperidin-1-yl)oxyl, 4-amino-(2,2,6,6-tetramethylpiperidin-1-yl)oxyl, 4-acetamido-(2,2,6,6-tetramethylpiperidin-1-yl)oxyl, bis(2,2,6,6-tetramethyl-piperidyl)sebacate, bis(2,2,6,6-tetramethyl-piperidyl)succinate, bis(1,2,2,6,6-pentamethylpiperidyl)sebacate, bis (1,2,2, 6,6-pentamethylpiperidyl)-n-butyl-3,5-di-tert-butyl-4-hydroxybenzylmalonate, tris(2,2,6,6-tetramethyl-4-piperidyl)nitrilotriacetate, tetrakis(2,2,6,6-tetramethyl-4-piperidyl)-1,2,3,4-butane-tetracarboxylate, 1,1'-(1,2-ethanediyl)-bis(3,3,5,5-tetramethylpiperazinone), 4-benzoyl-2,2,6,6-tetramethylpiperidine, 4-stearyloxy-2,2, 6,6-tetramethylpiperidine, bis(1,2,2,6,6-pentamethylpiperidyl)-2-n-butyl-2-(2-hydroxy-3,5-di-tert-butylbenzyl)malonate, 3-n-octyl-7,7,9,9-tetramethyl-1,3,8-triazasprio[4.5] decan-2,4-dione, bis(1-octyloxy-2,2,6,6-tetramethylpiperidyl)sebacate, bis(1-octyloxy-2,2,6,6-tetramethyl-piperidyesuccinate, 8-acetyl-3-dodecyl-7,7,9,9-tetramethyl-1,3,8-triazaspiro[4.5]decane-2,4-dione, 3-dodecyl-1-(2,2,6, 6-tetramethyl-4-piperidyl)pyrrolidin-2,5-dione, and 3-dodecyl-1-(1,2,2,6,6-pentamethyl-4-piperidyl)pyrrolidine-2,5-dione.

Suitable hydroxyaryl-1,3,5-triazines useful as curing agents in the present compositions are those having the structure of formula (8)

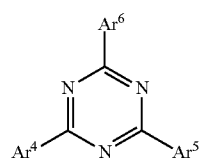

(8)

wherein $Ar^4$, $Ar^5$ and $Ar^6$ are independently aromatic moieties having from 1 to 3 aromatic rings, each of which may be unsubstituted or substituted; wherein in at least one of $Ar^4$, $Ar^5$ and $Ar^6$ is substituted with hydroxyl. By "substituted aromatic ring" is meant that one or more hydrogens on an aromatic ring are replaced with one or more substituents chosen from hydroxy, $C_{1-20}$ alkyl, $C_{1-20}$ alkoxy, halo, $C_{1-20}$ haloalkyl, $C_{1-20}$ carboxy, amino, $C_{1-20}$ acylamino, and $OR^{15}$, wherein $R^{15}$ is an organic radical having from 1 to 25 carbon atoms. Preferred substituents for each aromatic ring are hydroxy, $C_{1-20}$ alkyl, $C_{1-20}$ alkoxy, halo, $C_{1-20}$ haloalkyl, $C_{1-20}$ carboxy, and $OR^{15}$, and more preferably hydroxy, $C_{1-10}$ alkyl, $C_{1-10}$ alkoxy, $C_{1-20}$ carboxy, and $OR^{15}$. Preferably, each of $Ar^4$, $Ar^5$ and $Ar^6$ is unsubstituted or substituted phenyl or naphthyl, and more preferably unsubstituted or substituted phenyl. It is preferred that each aromatic moiety is unsubstituted or substituted with one or two substituents, and more preferably each aromatic moiety is substituted with one or two substituents. It is further preferred that in the hydroxyl-substituted aromatic moiety the hydroxyl substituent is ortho to the triazine ring. Preferably, the hydroxyaryl-1,3,5-triazine curing agents have the structure shown in formula (9)

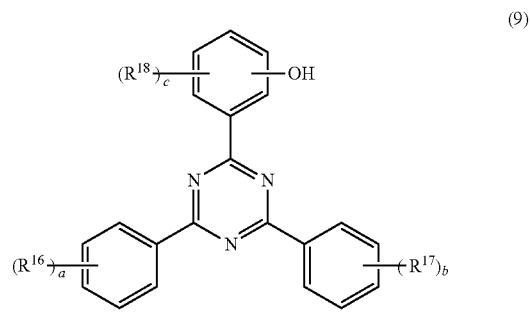

(9)

wherein each $R^{16}$, $R^{17}$ and $R^{18}$ is independently chosen from hydroxy, $C_{1-20}$ alkyl, $C_{1-20}$ alkoxy, halo, $C_{1-20}$ haloalkyl, $C_{1-20}$ carboxy, amino, $C_{1-20}$ acylamino, and $OR^{15}$; $R^{15}$ is an organic radical having from 1 to 25 carbon atoms; a and b are each integers from 0 to 3; and c is an integer from 0 to 2. It is preferred that each of a and b is an integer from 0 to 2, and more preferably 1 or 2. It is preferred that c is an integer from 0 to 1, and more preferably c is 1. Each of $R^{16}$, $R^{17}$ and $R^{18}$ is preferably independently chosen from hydroxy, $C_{1-10}$ alkyl, $C_{1-20}$ alkoxy, halo, $C_{1-20}$ carboxy, $C_{1-20}$ acylamino, and $OR^{15}$, and more preferably from hydroxy, $C_{1-10}$ alkyl, $C_{1-20}$ alkoxy, $C_{1-20}$ carboxy, and $OR^{15}$. More preferably, each $R^{16}$ and $R^{17}$ is independently chosen from hydroxy, $C_{1-10}$ alkyl, $C_{1-20}$ alkoxy, halo, $C_{1-20}$ carboxy, and $OR^{15}$, and more preferably from hydroxy, $C_{1-10}$ alkyl, and $C_{1-20}$ alkoxy. It is further preferred that each $R^{18}$ is independently chosen from hydroxy, $C_{1-10}$ alkyl, $C_{1-20}$ alkoxy, halo, $C_{1-20}$ carboxy, and $OR^{15}$, and more preferably from hydroxy, $C_{1-10}$ alkyl, $C_{1-20}$ alkoxy, and $OR^{15}$. Exemplary hydroxyaryl-1,3,5-triazines include, but are not limited to, 2,4,6-tris(2-hydroxy-4-octyloxyphenyl)-1,3,5-triazine, 2-(2-hydroxy-4-octyloxyphenyl)-4, 6-bis(2,4-dimethylphenyl)-1, 3,5-triazine, 2-(2,4-dihydroxyphenyl)-4,6-bis(2,4-dimethyl-phenyl)-1,3,5-triazine, 2,4-bis(2-hydroxy-4-propyloxyphenyl)-6-(2,4-dimethyl-phenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis (2,4-dimethylphenyl)-1,3,5-triazine, 2-12-hydroxy-4-(2-hydroxy-3-butyloxy-propoxy)phenyl-4,6-bis(2,4-dimethyl)-1, 3,5-triazine, 2-12-hydroxy-4-(2-hydroxy-3-octyloxypropyloxy)phenyl-4,6-bis(2,4-dimethyl)-1,3,5-triazine, and the compounds of formula (10)

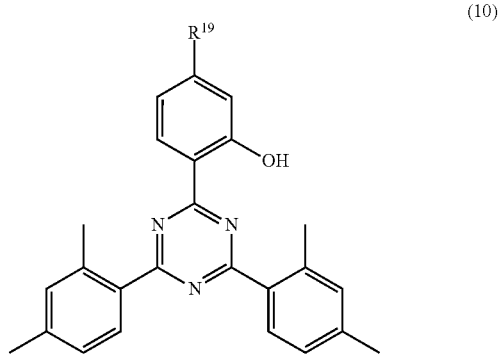

(10)

wherein R$^{19}$ is chosen from

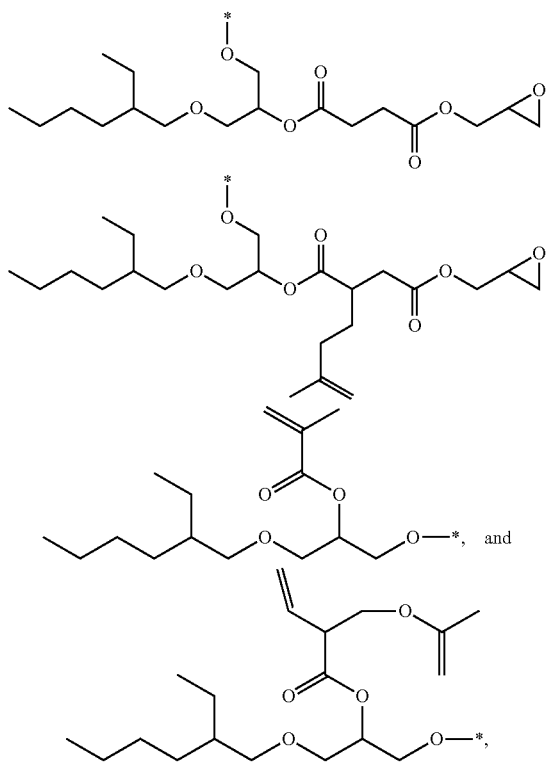

wherein * denotes the point of attachment to the phenyl ring.

Condensates of sterically hindered amines and 1,3,5-triazines useful as curing agents in the present invention include, but are not limited to, the condensate of N,N-bis-(2,2,6,6-tetramethyl-4-piperidyl)hexamethylenediamine and 4-morpholino-2,6-dichloro-1,3,5-triazine, the condensate of 2-chloro-4,6-bis(4-n-butylamino-2,2,6,6-tetramethylpiperidyl)-1,3,5-triazine and 1,2-bis(3-aminopropylamino)ethane, the condensate of 2-chloro-4,6-di-(4-n-butylamino-1,2,2,6,6-pentamethylpiperidyl)-1,3,5-triazine and 1,2-bis-(3-aminopropylamino)ethane, and the condensate of N,N'-bis(2,2,6,6-tetramethyl-4-piperidyl)hexamethylenediamine and 4-tert-octylamino-2,6-dichloro-1,3,5-triazine.

Suitable organic solvents useful in the present compositions include, but are not limited to, one or more of the organic solvents described above for the preparation of arylene oligomers and solvents conventionally used in the electronics industry, such as propylene glycol methyl ether (PGME), propylene glycol methyl ether acetate (PGMEA), methyl 3-methoxypropionate (MMP), ethyl lactate, anisole, N-methyl pyrrolidone, gamma-butyrolactone (GBL), ethoxybenzene, benzyl propionate, and a mixture of dimethylsulfoxide, triethyl phosphate, and GBL. Preferred organic solvents are benzyl esters of C$_{2-4}$ alkanecarboxylic acids, dibenzyl esters of C$_{2-4}$ alkanedicarboxylic acids, tetrahydrofurfuryl esters of C$_{2-4}$ alkanecarboxylic acids, ditetrahydrofurfuryl esters of C$_{2-4}$ alkanedicarboxylic acids, phenethyl esters of C$_{2-4}$ alkanecarboxylic acids, diphenethyl esters of C$_{2-4}$ alkanedicarboxylic acids, C$_{1-6}$ alkoxy-substituted benzenes, benzyl C$_{1-6}$ alkyl ethers, PGME, PGMEA, MMP, ethyl lactate, anisole, N-methyl pyrrolidone, gamma-butyrolactone, ethoxybenzene, and benzyl propionate. Exemplary organic solvents include, without limitation, benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, benzyl methyl ether, and benzyl ethyl ether, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, PGME, PGMEA, MMP, ethyl lactate, anisole, N-methyl pyrrolidone, gamma-butyrolactone, ethoxybenzene, and benzyl propionate.

In general, the present compositions comprise a total amount of the one or more arylene oligomers of from 1 to 35 wt % of solids, and preferably from 5 to 20 wt % of solids. The total amount of the one or more curing agents in the present compositions is from 0.1 to 15 wt % of solids, preferably from 0.5 to 15 wt %, more preferably from 0.5 to 10 wt %, and yet more preferably from 0.5 to 5 wt %. Such compositions can be used to deposit an oligomer coating on a substrate, where the oligomer coating layer has a thickness of from 50 nm to 500 μm, preferably from 100 nm to 250 μm, and more preferably from 100 nm to 50 μm. Thicker coatings may require more than one coating step.

Compositions of the invention may be prepared by combining the one or more arylene oligomers, one or more curing agents, and one or more organic solvents in any order. It is preferred that the one or more curing agents are added to a mixture of the one or more arylene oligomers and the one or more organic solvents.

In use, the present compositions may be coated by any suitable method on any suitable substrate surface. Suitable methods for coating the compositions include, but are not limited to, spin-coating, curtain coating, spray coating, roller coating, dip coating, slot die coating, and vapor deposition, among other methods. In the electronics manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the composition dispensed on the wafer or substrate depends on the total solids content in the composition, the desired thickness of the resulting coating layer, and other factors well-known to those skilled in the art. It may be advantageous in certain applications where improved adhesion to the substrate is desired to first treat the substrate surface with an adhesion promoting composition before coating a layer of the present compositions on the substrate surface. Such adhesion promoting compositions and their use are well known in the art.

Preferably, after being disposed on a substrate surface, the oligomer composition is heated (soft baked) to at least partially remove, and preferably remove, any organic solvent present. Typical baking temperatures are from 90 to 140° C., although other suitable temperatures may be used. Such baking to remove residual solvent is typically done for approximately 30 sec. to 2 min, although longer or shorter times may suitably be used. Following solvent removal, a layer, film or coating of the oligomer on the substrate surface is obtained. Preferably, the oligomer is next cured, such as by heating to at a temperature of ≥300° C., preferably ≥350° C., and more preferably ≥400° C. Such curing step may take from 2 to 180 min, preferably from 10 to 120 min, and more preferably from 15 to 60 min, although other suitable times may be used. In one embodiment, a belt furnace may be used to cure the oligomer layer on a substrate. During curing, it is believed that the present oligomers further polymerize.

While curing of arylene oligomers is conventionally performed under an inert atmosphere, such as nitrogen, the present invention readily allows curing of such oligomers in an oxygen-containing atmosphere. The present compositions allow for the curing of arylene oligomers in an atmosphere comprising 100 ppm or more of oxygen, and preferably in air. In one aspect, the present invention provides a method of curing an arylene oligomer comprising: disposing a composition comprising one or more curable arylene oligomers, one or more curing agents and one or more organic solvents on a substrate surface; at least partially removing the one or more organic solvents; and curing the one or more arylene oligomers in an oxygen-containing atmosphere. An advantage of the present invention is that the cured arylene oligomers from the compositions of the invention, when cured in an oxygen-containing atmosphere, have improved mechanical properties as compared to cured arylene oligomers obtained from conventional arylene oligomer compositions. For example, when cured in air, cured arylene coatings from the present compositions show reduced thermal weight loss as compared to air cured convention arylene coatings, such as a 10%, 15%, 20%, 25%, 30%, 35% 40% or >40% reduction in weight loss upon heating the cured arylene coating in air at 400° C. for 60 minutes. In order to be useful for certain applications, polyarylene films need to have a weight loss of <1% when heated to 400° C. for 1 hr.

The present invention further provides a method of forming a coated inorganic film comprising: providing an inorganic film; coating a layer of a composition comprising one or more curable arylene oligomers, one or more curing agents and one or more organic solvents on a surface of the inorganic film; removing the one or more organic solvents from the coating layer; curing the coating layer in an oxygen-containing atmosphere to form a coated inorganic film. A protective film may be disposed on the coated inorganic film, that is, disposed on the cured arylene coating. Various protective films known in the art may be used, such as polyethylene or other protective films known in the field of dry film lamination materials. Transparent inorganic films are particularly suitable for use with this method. Exemplary transparent films include, without limitation, $Al_2O_3$, $Si_3N_4$, $SiO_2$ $TiO_2$, and $ZrO_2$. This method is particularly useful in a roll-to-roll application, where the inorganic film is provided from a roll, and the optional protective film is also provided from a roll, and the coated inorganic film is taken up on a roll.

Figure 2:
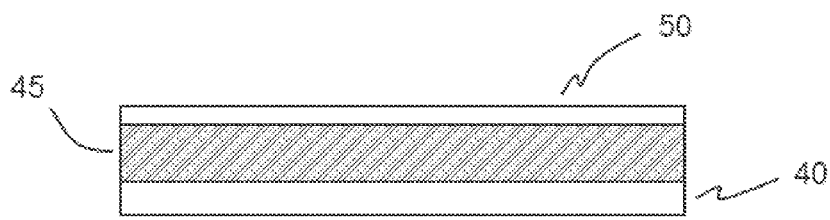
FIG. 2 is a cross-sectional representation of a structure produced according to the process of the invention.

FIG. 1 illustrates a cross-sectional view of a roll-to-roll process utilizing the compositions of the invention. In FIG. 1, a strip of inorganic film 11, such as $Al_2O_3$, is unwound from roll 10, with arrow on roll 10 indicating the direction of travel. A composition comprising one or more curable arylene oligomers, one or more curing agents, and one or more organic solvents is coated on inorganic film 10 from coating head 15 to provide coated inorganic film 16. Coated inorganic film 16 is conveyed to curing means 20 and subjected to conditions sufficient to remove any remaining organic solvent and cure the arylene oligomer coating. A wide variety of curing means may be used, such as: a furnace oven; forced hot air dryer; infrared, ultraviolet, microwave or other form of electromagnetic radiation; one or more heated rollers; and any combination of these. Optional protective film 26, such as a polyethylene film, is conveyed from roll 25 and laminated to the surface of the cured arylene coating on the inorganic film by means of rollers 30A and 30B and the resulting laminated structure 28 is conveyed to take up roller 35. Optional protective film 26 may be laminated to cured coated inorganic film 16 by pressure from rollers 30A and 30B alone, or optionally with pressure and heat, such as by heating one or both of rollers 30A and 30B. FIG. 2 illustrates a cross-sectional view of the structure obtained from the process of FIG. 1 comprising inorganic film 40, cured arylene polymer coating 45 disposed on inorganic film 40, and optional protective film 50 disposed on cured arylene polymer coating 45. Also provided by the present invention is a structure comprising an inorganic film, preferably a transparent inorganic film, a cured arylene polymer coating disposed on, preferably disposed directly on, the inorganic film, and optionally a protective film disposed on, preferably directly on, the cured arylene polymer. Preferably, the structure is provided in the form of a roll.

EXAMPLE 1

Preparation of Polyphenylene Oligomer 1

To a multi-neck round-bottomed flask containing a stir bar, diphenylene oxide bis(triphenylcyclopentadienone) (DPO-CPD, 10.95 g, 13.98 mmol) was added via powder funnel, followed by the addition of 33 mL of ethoxybenzene. The mixture was stirred gently at room temperature. The flask was next equipped with a reflux condenser and an internal thermocouple probe attached to a self-regulating thermostat control for a heating mantle, and placed under a nitrogen atmosphere. At this point, 1,3-diethynylbenzene (DEB, 2.0 mL, 15.38 mmol, 1.1 equivalents) was added via syringe. The dark maroon contents of the flask were warmed to an internal temperature of 160° C. over the course of 30 minutes and maintained at this temperature for 2 hours before cooling to room temperature by removal of the heating element. At this point, 33 mL of ethoxybenzene were added to the solution, and the vessel was further cooled to room temperature to provide Oligomer 1.

EXAMPLE 2

Preparation of Polyphenylene Oligomer 2

A polyphenylene oligomer is prepared by reacting 1 equivalent of DPO-CPD with 0.3 equivalents of a mixture of 1,3,5-trisphenylethynylbenzene (TRIS) and 0.6 equivalents of DEB in N-methylpyrrolidone (NMP) to provide Oligomer 2, according to the general procedure described in U.S. Pat. No. 5,965,679.

EXAMPLE 3

The procedure of Example 1 is repeated except the monomers and the molar ratios used are replaced by those shown in Table 1. The reaction solvent is ethoxybenzene, anisole, dimethoxybenzene, benzyl priopionate, or NMP. The following abbreviations are used in Table 1: DP-CPD=diphenylene bis(triphenylcyclopentadienone); N-CPD=naphthylene bis(triphenylcyclopentadienone); PFPDP-CPD=perfluoropropyl-2,2-diphenylene bis(triphenylcyclopentadienone); DEMB=1,3-diethynyl-5-methylbenzene; DEMeOB=1,3-diethynyl-5-methoxylbenzene; DEMBP=3,5-diethynyl-4'-methyl-1,1'-biphenyl; and p-DEB=1,4-diethylbenzene.

TABLE 1

| Oligomer | First Monomer | Second Monomer | Monomer Mole Ratio |
|---|---|---|---|
| 3 | DPO-CPD | DEMB | 1:1.07 |
| 4 | DP-CPD | DEMB | 1:1.03 |
| 5 | DP-CPD | DEMeOB | 1:1.12 |
| 6 | DPO-CPD | p-DEB | 1:1.05 |
| 7 | PFPDP-CPD | DEB | 1:1.05 |
| 8 | N-CPD | DEMBP | 1:1.1 |
| 9 | DPO-CPD | TRIS | 1:1.1 |

EXAMPLE 4

Coating samples are prepared by combining Oligomer 1 (15 wt % solids) in ethoxybenzene with the curing agents shown in Table 2. The amount of the curing agent is reported in wt %, based on total solids. Curing agent A is (2,2,6,6-tetramethylpiperidin-1-yl)oxyl (TEMPO), curing agent B is 1-(4-(4,6-bis(2,4-dimethylphenyl)-1,3,5-triazin-2-yl)-3-hydroxyphenoxy)-3-((2-ethylhexyl)oxy)propan-2-yl methacrylate (TIMA, formula (10) where $R^{19}$ is

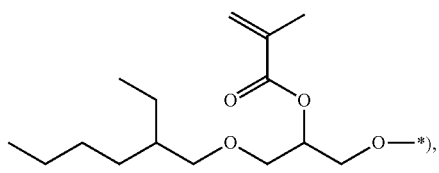

and curing agent C is 4-hydroxy-(2,2,6,6-tetramethylpiperidin-1-yl)oxyl (HO-TEMPO).

TABLE 2

| Sample | Oligomer | Curing Agent | Amount of Curing Agent (wt %) |
|---|---|---|---|
| 1 | 1 | A | 0.5 |
| 2 | 1 | A | 1 |
| 3 | 1 | A | 3 |
| 4 | 1 | B | 0.5 |
| 5 | 1 | B | 1 |
| 6 | 1 | B | 3 |
| 7 | 1 | C | 1 |

EXAMPLE 5

Coating samples are prepared by combining the oligomers (at 15 wt % solids) in ethoxybenzene with the curing agents shown in Table 3. The amount of the curing agent is reported in wt %, based on total solids. Curing agents A, B, and C are as described in Example 4, curing agent D is 2,4,6-tris(2-hydroxy-4-octyloxyphenyl)-1,3,5-triazine, and curing agent E has the formula (11)

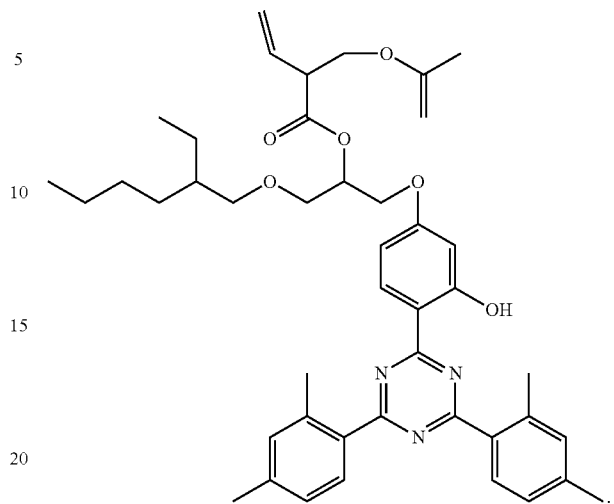

(11)

TABLE 3

| Sample | Oligomer | Curing Agent | Amount of Curing Agent (wt %) |
|---|---|---|---|
| 8 | 9 | A | 1 |
| 9 | 9 | B | 3 |
| 10 | 9 | B | 5 |
| 11 | 9 | B | 7 |
| 12 | 2 | A | 7 |
| 13 | 2 | B | 5 |
| 14 | 4 | C | 4 |
| 15 | 4 | D | 3 |
| 16 | 5 | E | 5 |
| 17 | 6 | E | 0.5 |
| 18 | 6 | E | 3 |
| 19 | 6 | D | 1 |

EXAMPLE 6

Samples were evaluated for thermal stability. Comparative Sample C1 contained Oligomer 1 (at 14 wt % solids) in ethoxybenzene with no curing agent. Comparative Sample C2 contained Oligomer 9 ($M_n$=8800, at 14 wt % solids) in a mixture of PGMEA/cyclopentanone/GBL (88.2/9.8/2 w/w/w) with no curing agent. Each of the Samples reported in Table 4 was used to deposit a film having a target thickness of 1 μm on a glass substrate (Eagle glass from Samsung Corning) by spin-coating using a spin speed of 1000 rpm for 90 sec., followed by baking at 110° C. for 60 sec. to remove any residual solvent. The coated glass substrates were transferred to an oven at room temperature and cured by in air heating the oven at a rate of 5° C/min to 400° C., and then held at 400° C. for 1 hour. After curing, each sample was cooled to room temperature and then the cured film was scraped off the substrate and placed in a thermogravimetric analysis (TGA) pan. Each sample was then evaluated by TGA in a $N_2$ atmosphere using the following testing recipe:

1. Ramping to 150° C. at a rate of 20° C/min and holding for 15 min;
2. Ramping up to 440° C. at a rate of 20° C/min. and holding for 1 min.; and
3. Ramping up to 450° C. at a rate of 1° C/min and holding for 120 min The percentage weight loss after 60 min and 120 min was determined and is reported in Table 4. As can be seen from the data, the present of a curing agent of the invention in the samples greatly reduces the amount of film weight loss. In particular, the present curing agents show a reduction in weight loss of 25 to 50% as compared to comparative sample C1. Similar results were obtained when the films were cured in air for 1 hr. at 370° C. or for 30 min at 420° C.

TABLE 4

| Sample No. | Weight Loss (%) after 1 hr. | Weight Loss (%) after 2 hr. |
| --- | --- | --- |
| C1 | 0.84 | 1.0 |
| C2 | 1.84 | 2.38 |
| 2 | 0.63 | 0.68 |
| 3 | 0.45 | 0.57 |
| 5 | 0.42 | 0.57 |
| 6 | 0.44 | 0.59 |

EXAMPLE 7

The procedure of Example 6 was repeated, except that the coated samples were cured in an air atmosphere at 300° C. for 2 hrs. After curing, the samples were cooled, and subjected to TGA analysis as described in Example 6. The weight loss after 1 hr. at 450° C. is reported in Table 5. While the lower curing temperature used resulted in greater weight loss at 450° C., the present curing agents still reduced film weight loss by 25 to 30% as compared to comparative sample C1.

TABLE 5

| Sample No. | Weight Loss (%) after 1 hr. |
| --- | --- |
| C1 | 1.39 |
| C2 | 1.27 |
| 1 | 1.05 |
| 2 | 0.98 |

EXAMPLE 8

The procedure of Example 7 was repeated, except that the adhesion of the cured coatings to the glass substrates was evaluated using a conventional cross-hatch test. After curing, a lattice pattern test area was cut into each cured oligomer film using a cross-hatch cutter. Any loose film particles were then removed from the lattice patterned test area. SCOTCH ™ brand 600 tape (available from 3M, Minneapolis, Minn.) was firmly applied over each lattice pattern and removed quickly by pulling the tape back off of the test area to reveal the amount of film removed by the tape. Each test area was then visually compared to ASTM standards D3002 and D3359, where a rating of 5B indicates no loss of film and a rating of OB indicates extensive film loss. The cured films from each of Comparative Sample C1, Sample 1, and Sample 2 showed very good adhesion (each had a rating of 5B). The present curing agents do not negatively impact the adhesion of the cured films.

EXAMPLE 9

Comparative

Samples of Comparative Sample C2 (having no curing agent) from Example 6 were used to deposit a film having a target thickness of 1 μm on a glass substrate (Eagle glass from Corning Inc.) by spin-coating using a spin speed of 1000 rpm for 90 sec., followed by baking at 110° C. for 60 sec. to remove any residual solvent. The coated glass substrates were transferred to an oven at room temperature and cured in air by heating the oven at a rate of 5° C/min. to 370, 400, or 430° C., and then held at that temperature for 30 min. Samples of the cured film from each curing temperature were then evaluated by TGA in a $N_2$ atmosphere according to the procedure of Example 6. The weight loss data after 60 min. at 450° C. are reported in Table 6. The adhesion of samples of the cured film from each curing temperature was also evaluated according to the procedure of Example 8. The adhesion rating of each of the cured films is also reported in Table 6. When arylene oligomers are cured in air without a curing agent of the invention, the data in Table 6 clearly show that increasing the curing temperature results in reduced adhesion of the cured arylene oligomer film to the to the substrate.

TABLE 6

| Curing Temperature | Weight Loss | Adhesion Rating |
| --- | --- | --- |
| 370° C. | 1.11% | 5B |
| 400° C. | 1.24% | 4B |
| 430° C. | 1.17% | 2B |

EXAMPLE 10

Comparative

The procedure of Example 9 was repeated using samples of Comparative Sample C1 (having no curing agent) from Example 6, and curing in air by heating the oven at a rate of 5° C/min to 370, 400, 430, or 450° C., and then held at that temperature for 30 min. Samples of the cured film from each curing temperature were then evaluated by TGA in a $N_2$ atmosphere according to the procedure of Example 7. The weight loss data after 60 min. at 450° C. are reported in Table 6. The adhesion of samples of the cured film from each curing temperature was also evaluated according to the procedure of Example 8. The adhesion rating of each of the cured films is also reported in Table 7. When arylene oligomers are cured in air without a curing agent of the invention, the data in Table 7 clearly show that increasing the curing temperature results in reduced adhesion of the cured arylene oligomer film to the to the substrate.

TABLE 7

| Curing Temperature | Weight Loss | Adhesion Rating |
| --- | --- | --- |
| 370° C. | 1.80% | 4B |
| 400° C. | 1.51% | 3B |
| 430° C. | 2.27% | 2B |
| 450° C. | 3.05% | 1B |

What is claimed is:

1. A composition comprising one or more curable arylene oligomers comprising as polymerized units one or more first monomers having two cyclopentadienone moieties and one or more second monomers having two or more alkyne moieties; one or more curing agents of the formula

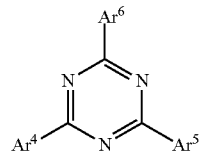
(8)

wherein $Ar^4$, $Ar^5$ and $Ar^6$ are independently aromatic moieties having from 1 to 3 aromatic rings, each of which may be unsubstituted or substituted; wherein in at least one of $Ar^4$, $Ar^5$ and $Ar^6$ is substituted with hydroxyl; and one or more organic solvents.

2. The composition of claim 1 wherein the one or more first monomers have the structure shown in formula (1)

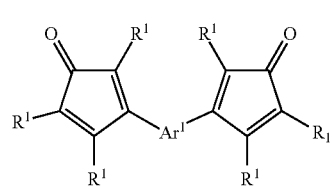
(1)

wherein each $R^1$ is independently chosen from H, $C_{1-6}$ alkyl, phenyl, or substituted phenyl; and $Ar^1$ is an aromatic moiety.

3. The composition of claim 2 wherein each $R^1$ is phenyl.

4. The composition of claim 1 wherein the one or more second monomers are chosen from compounds of formula (5) and formula (6)

(5)

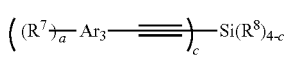
(6)

wherein a is an integer from 0 to 4; b is 2 or 3; c is 2 or 3; each $R^6$ is independently chosen from H, $Si(R^8)_3$, $C_{1-10}$ alkyl, $C_{1-10}$ alkoxy, $C_{7-15}$ aralkyl, $C_{6-10}$ aryl, and substituted $C_{6-10}$ aryl; each $R^7$ is independently chosen from H, $C_{1-10}$ alkyl, $C_{1-10}$ alkoxy, $C_{7-15}$ aralkyl, $C_{6-10}$ aryl, and substituted $C_{6-10}$ aryl; each $R^8$ is independently chosen from H, halogen, hydroxyl, $C_{1-10}$ alkyl, $C_{1-10}$ alkoxy, $C_{7-15}$ aralkyl, $C_{7-15}$ aralkoxy, $C_{6-10}$ aryl, $C_{6-20}$ aryloxy, and substituted $C_{6-10}$ aryl; and $Ar^3$ is $C_{6-10}$ aryl.

5. The composition of claim 1, wherein each of $Ar^4$, $Ar^5$ and $Ar^6$ is unsubstituted or substituted phenyl or naphthyl.

6. The composition of claim 1, wherein the one or more curing agents have the formula

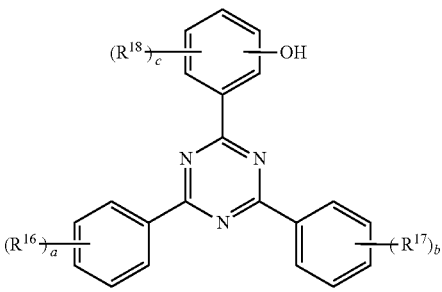
(9)

wherein each $R^{16}$, $R^{17}$ and $R^{18}$ is independently chosen from hydroxy, $C_{1-20}$ alkyl, $C_{1-20}$ alkoxy, halo, $C_{1-20}$ haloalkyl, $C_{1-20}$ carboxy, amino, $C_{1-20}$ acylamino, and $OR^{15}$; $R^{15}$ is an organic radical having from 1 to 25 carbon atoms; a and b are each integers from 0 to 3; and c is an integer from 0 to 2.

7. A method of curing an arylene oligomer comprising: disposing a composition comprising one or more curable arylene oligomers comprising as polymerized units one or more first monomers having two cyclopentadienone moieties and one or more second monomers having two or more alkyne moieties; one or more curing agents of the formula

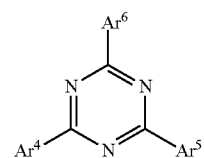
(8)

wherein $Ar^4$, $Ar^5$ and $Ar^6$ are independently aromatic moieties having from 1 to 3 aromatic rings, each of which may be unsubstituted or substituted; wherein in at least one of $Ar^4$, $Ar^5$ and $Ar^6$ is substituted with hydroxyl; and one or more organic solvents on a substrate surface; at least partially removing the one or more organic solvents; and curing the one or more arylene oligomers in air to form a cured arylene coating on the substrate.

8. The method of claim 7, wherein the one or more curing agents have the formula

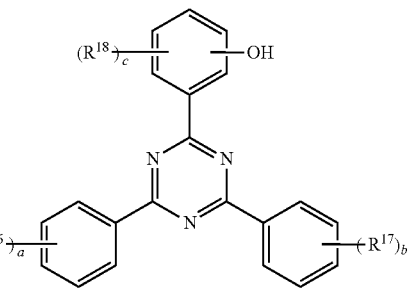
(9)

wherein each $R^{16}$, $R^{17}$ and $R^{18}$ is independently chosen from hydroxy, $C_{1-20}$ alkyl, $C_{1-20}$ alkoxy, halo, $C_{1-20}$ haloalkyl, $C_{1-20}$ carboxy, amino, $C_{1-20}$ acylamino, and $OR^{15}$; $R^{15}$ is an organic radical having from 1 to 25 carbon atoms; a and b are each integers from 0 to 3; and c is an integer from 0 to 2.

9. A method of forming a coated inorganic film comprising:

providing an inorganic film; coating a layer of a composition comprising one or more curable arylene oligomers comprising as polymerized units one or more first monomers having two cyclopentadienone moieties and one or more second monomers having two or more alkyne moieties; one or more curing agents of the formula

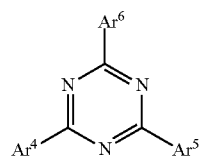

(8)

wherein $Ar^4$, $Ar^5$ and $Ar^6$ are independently aromatic moieties having from 1 to 3 aromatic rings, each of which may be unsubstituted or substituted; wherein in at least one of $Ar^4$, $Ar^5$ and $Ar^6$ is substituted with hydroxyl; and one or more organic solvents on a surface of the inorganic film; removing the one or more organic solvents from the coating layer; curing the coating layer in air to form a coated inorganic film.

10. The method of claim 9 further comprising disposing a protective film on the coated inorganic film.

11. The method of claim 9 wherein the inorganic film is transparent.

12. The method of claim 9 wherein the inorganic film is provided from a roll.

13. The method of claim 9, wherein the one or more curing agents have the formula

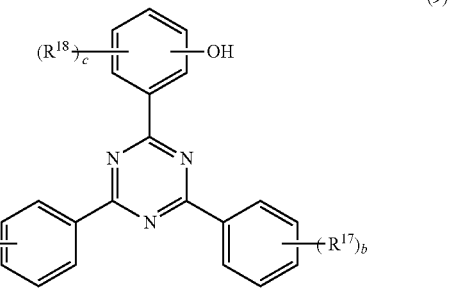

(9)

wherein each $R^{16}$, $R^{17}$ and $R^{18}$ is independently chosen from hydroxy, $C_{1-20}$ alkyl, $C_{1-20}$ alkoxy, halo, $C_{1-20}$ haloalkyl, $C_{1-20}$ carboxy, amino, $C_{1-20}$ acylamino, and $OR^{15}$; $R^{15}$ is an organic radical having from 1 to 25 carbon atoms; a and b are each integers from 0 to 3; and c is an integer from 0 to 2.

* * * * *